United States Patent [19]

Lacombat

[11] 4,155,642

[45] May 22, 1979

[54] MASK PHOTOREPEATER APPARATUS

[75] Inventor: Michel Lacombat, Paris, France

[73] Assignee: Thomson-CSF, Paris, France

[21] Appl. No.: 851,802

[22] Filed: Nov. 15, 1977

[30] Foreign Application Priority Data

Nov. 19, 1976 [FR] France ................................ 76 34914

[51] Int. Cl.² ............................................... G03B 27/42
[52] U.S. Cl. .......................................... 355/53; 355/54
[58] Field of Search ....................... 355/53, 54, 95, 96, 355/44, 45, 55, 56

[56] References Cited

U.S. PATENT DOCUMENTS

| | | | |
|---|---|---|---|
| 3,103,850 | 9/1963 | Khoury et al. | 355/56 |
| 3,260,153 | 7/1966 | Abbot, Jr. et al. | 355/73 X |
| 3,704,657 | 12/1972 | Sliwkowski | 355/53 X |
| 3,722,996 | 3/1973 | Fox | 355/53 |

Primary Examiner—L. T. Hix
Assistant Examiner—W. J. Brady
Attorney, Agent, or Firm—Cushman, Darby & Cushman

[57] ABSTRACT

A mask photorepeater apparatus for the production of small size masks has an objective-holder whose lens has a magnification very much less than 1 and an object-holder able to move in a plane. For each printing operation, under the action of servomechanisms, the objective-holder rises or drops to bring its object plane within the plane of the object to be printed.

8 Claims, 10 Drawing Figures

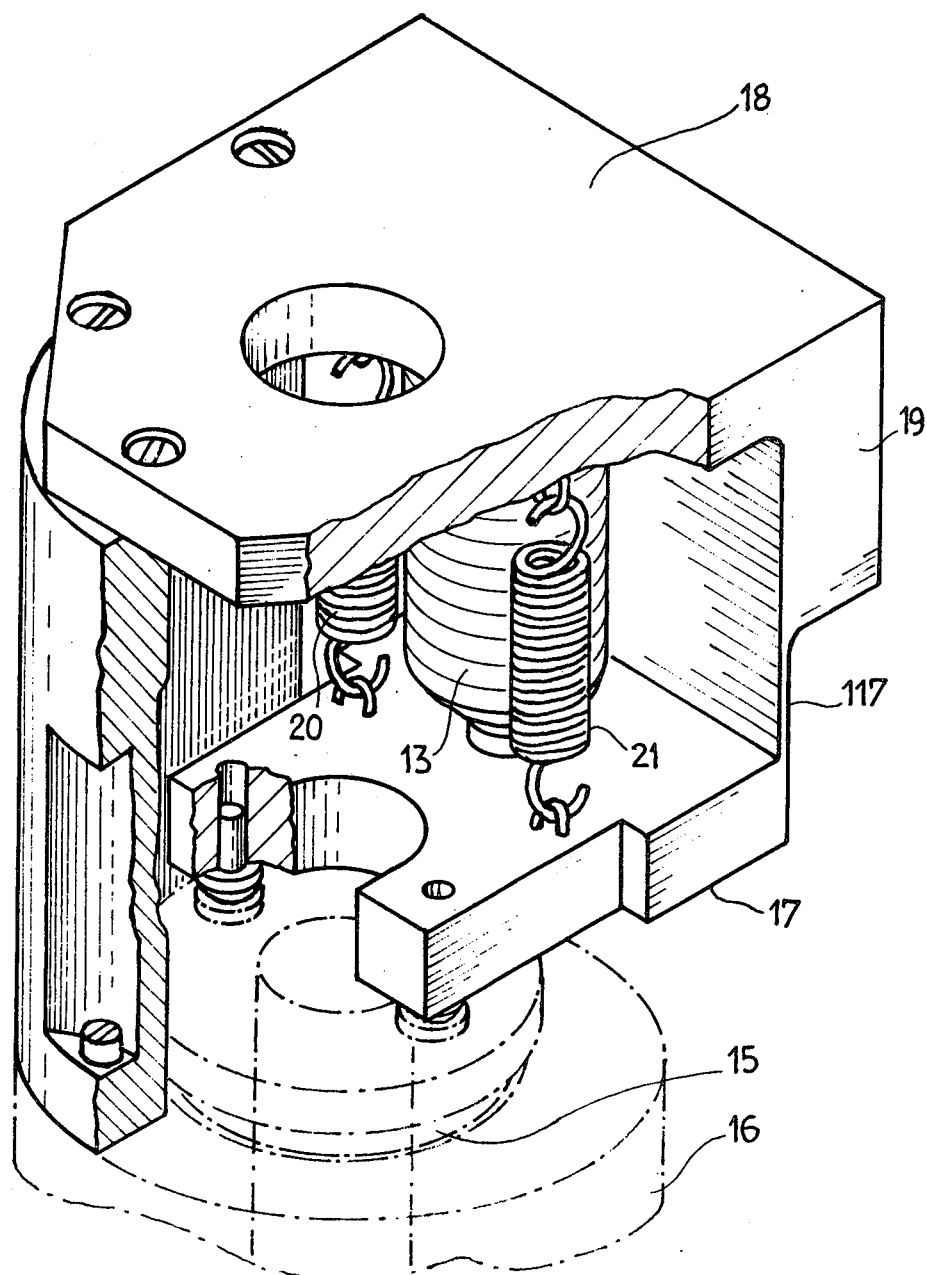

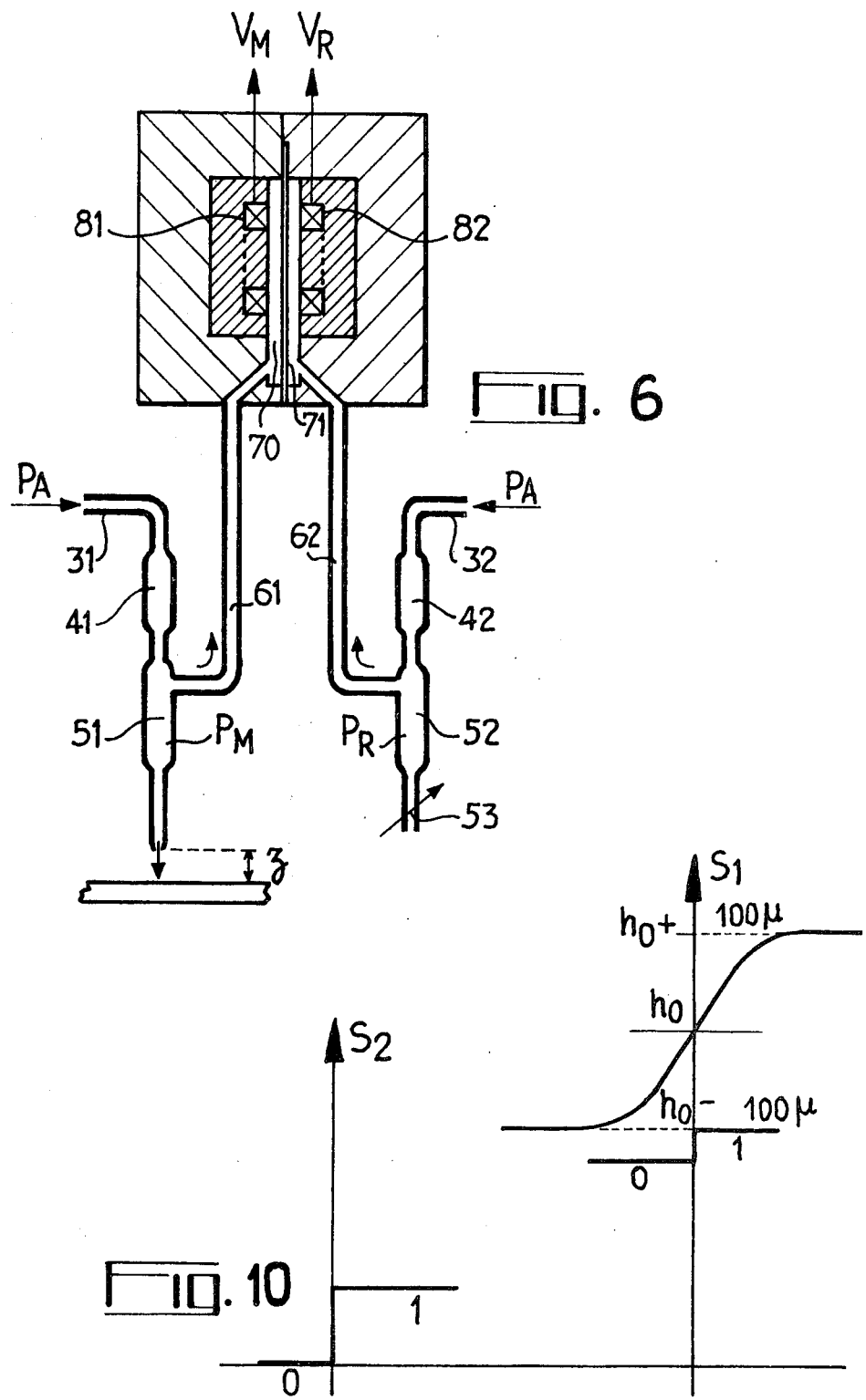

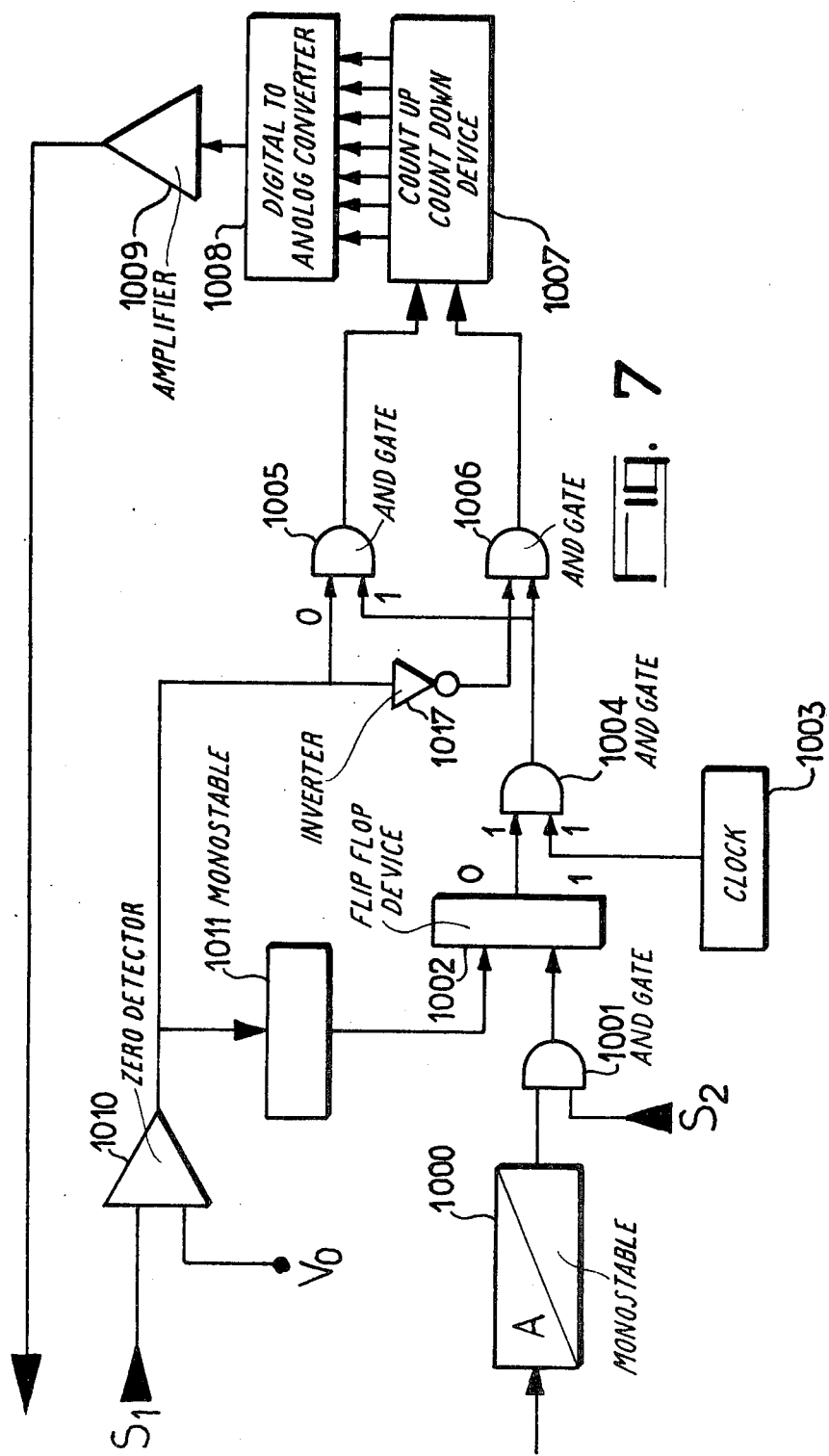

MASK PHOTOREPEATER APPARATUS

In the semiconductor field, the problem arises of arranging on the same sheet several images which are all of small size, identical and of high definition. It is necessary to arrange designs with a resolution of 1 micron on a sheet whose main dimensions do not exceed 10 centimeters (typically 3 inches or 75 millimeters). The solution to the problem is difficult for the following reasons:

In the case, optical devices are used, this being more particularly the subject of the invention, the field depth is of the order of ±2 microns at the wavelengths used.

Semiconductor slices, and especially those of silicon, have bulges on them which may be up to 10 microns, even assuming that their neutral fibre is flat. As a result, it is desirable to have enough space between the slice and the optical assembly to avoid damage.

Finally, it is desirable to have drawings with lines 1 micron thick.

An object of the invention is to provided a high resolution mask photorepeater making it possible to deal with these problems.

The mask photorepeater apparatus in accordance with the invention has a light source and a lens with a magnification less than or equal to 1, of the order of 1/10, which projects on the sample the mask image, the said sample being held by an object-holder fixed to a table on which are means for lining up certain areas of the said sample with the objective as required.

For each exposure, the object-holder is fixed and the optical assembly includes means enabling it to be moved along its optical axis to bring its image plane within the object plane; the said means include an elastic assembly in a particular direction, and electrically controlled means which tend to counteract more or less the action of this assembly, these means receiving control signals from sensors linked to the objective and able to measure the distance from its output lens to the object-holder plane.

The invention will be better understood from the description which follows by referring to the attached drawings in which:

FIG. 3 shows in perspective a way of producing the upper part of the mechanical device controlling the position of the objective;

FIG. 6 shows schematically a differential transducer used in a device complying with the invention;

FIG. 7 shows an example of a schematic diagram of a servo-control which can be used in a device in accordance with the invention;

FIG. 10 is a set of explanatory curves.

FIG. 1 shows in perspective and very schematically a high resolution photorepeater.

Figure 1:
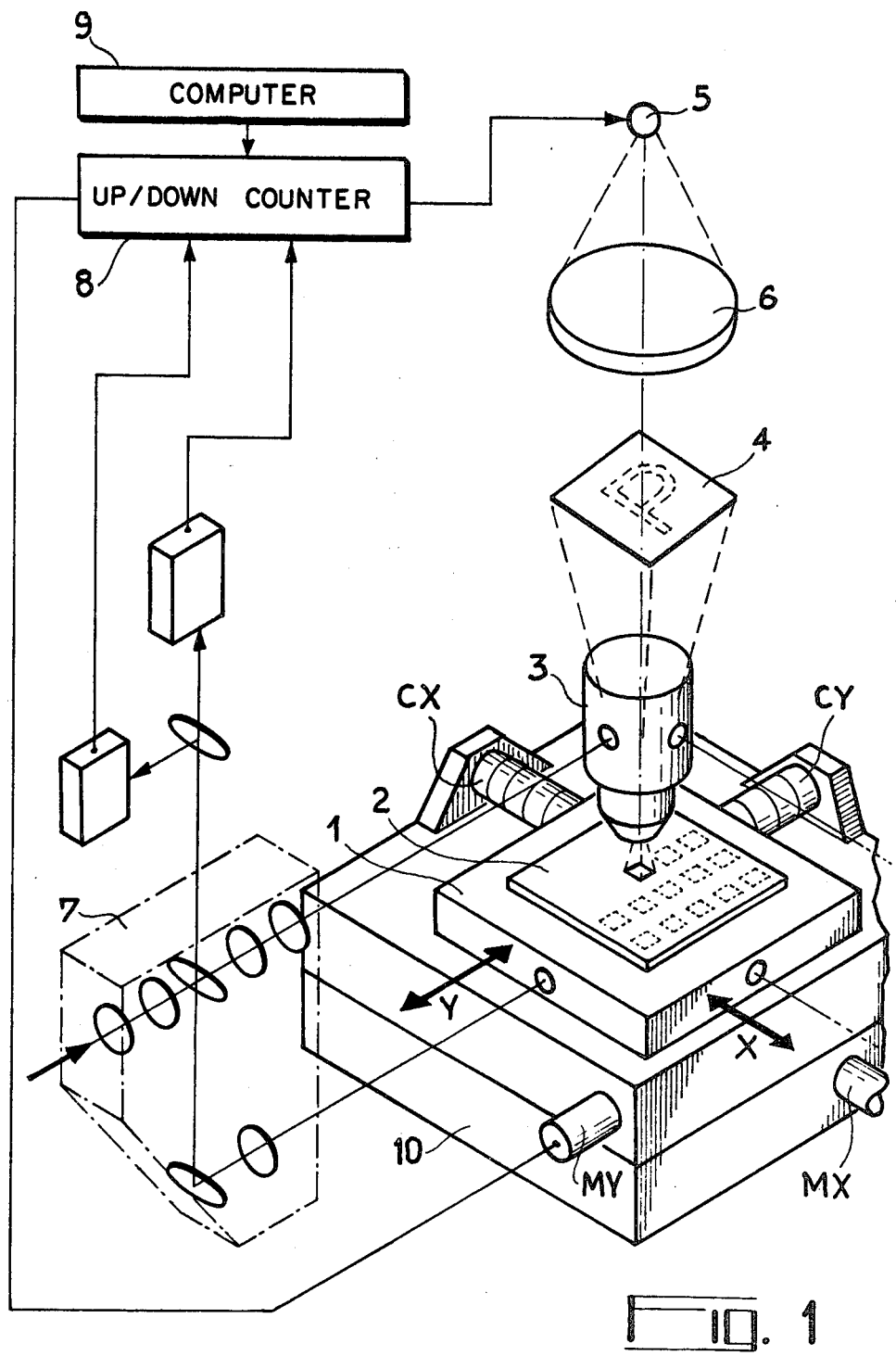
FIG. 1 shows a schematic diagram of photorepeater assembly.

It contains an object-holder 1 holding an object 2 on which the designs are to be reproduced, the designs being all of the same shape, of small dimensions and arranged in lines and columns for example.

The optical device 3 is arranged above the object-holder. Its lens forms a real image of a mask 4 on the object, the mask being lit by a source 5 through a condenser 6.

The object-holder can be moved in a horizontal plane by means of two motors MX and MY respectively, one causing a movement in the OX direction and the other a movement in the direction OY perpendicular to OX.

To control the movements along OX and OY, two coherent light interferometer systems are provided only one of which, 7, is shown.

Interferometer 7 is connected to a logic assembly which contains in particular an up-down counter 8 that is connected to an input of the computer 9 which controls the movements. The sample holder is blocked on a frame 10 by means of blocks CX and CY. This frame is controlled by motors MX and MY.

The problem the invention is intended to solve is the correction of the relative position of the object-holder with respect to the objective so that the former is always in the image plane of the latter. For this purpose, means are provided for the servo-control of the position of the objective with respect to that of the sample holder. It may be remembered that, in the cases normally encountered, the optical systems have a wide angle opening and a very small depth of field as a result. It is therefore necessary to have an adjustment control permanently available so as to compensate for flatness faults in the support and "wave" faults in the driving device. A device in accordance with the invention must make possible automatic focussing compatible with a resolution of 0.5 micron and a photo-repetition of 0.1 micron.

Figure 2:
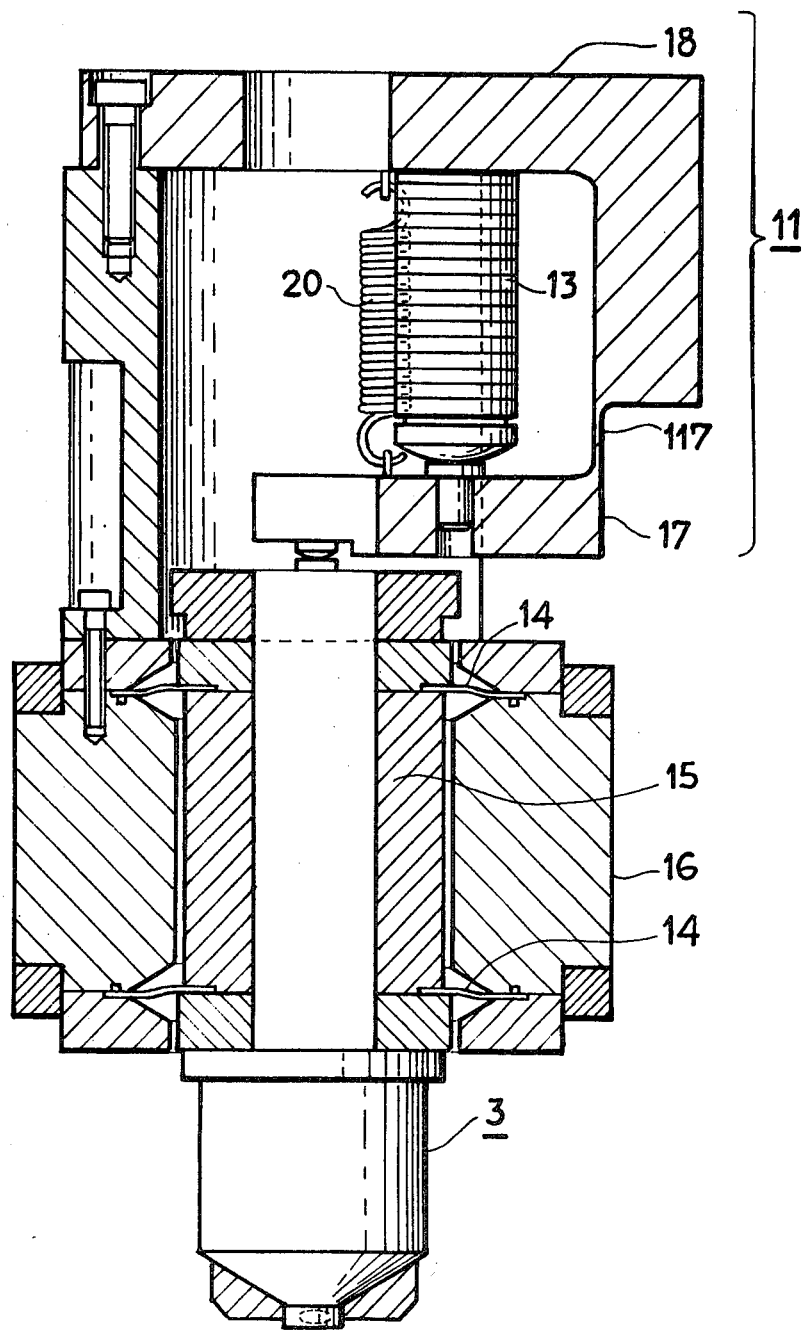
FIG. 2 shows the theoretical schematic diagram of a photorepeater in accordance with the invention.

FIG. 2 shows, in a cross-section schematically one possible embodiment of a device in accordance with the invention.

The optical assembly 3 is mounted in a tube 15 so as to able to slide along the axis of the tube. For this purpose, tube 15 is fixed to a base 16 wich carries the assembly by means of two elastic membranes 14 which tend to draw the objective upwards under the action of a preset stress. This tube supports a lower part which will be described latter.

Above this first assembly, which is the objective-holder properly speaking, is placed a metallic part 11, which has a thinned section 117 and roughly the form of a U.

This part is shown in perspective in FIG. 3.

It has an upper part 18 and a lower part 17 connected together by a vertical part 19 and the thinned section 117.

A piezoelectric bar 13, whose length is variable and a function of the voltage applied to it, presses on these two faces.

Two springs 20 and 21 tend to draw faces 18 and 19 towards each other. These springs and the piezoelectric rod are designed to act in opposition to the membranes so that part 11 exerts an effort on the whole objective-holder properly speaking.

Figure 5:
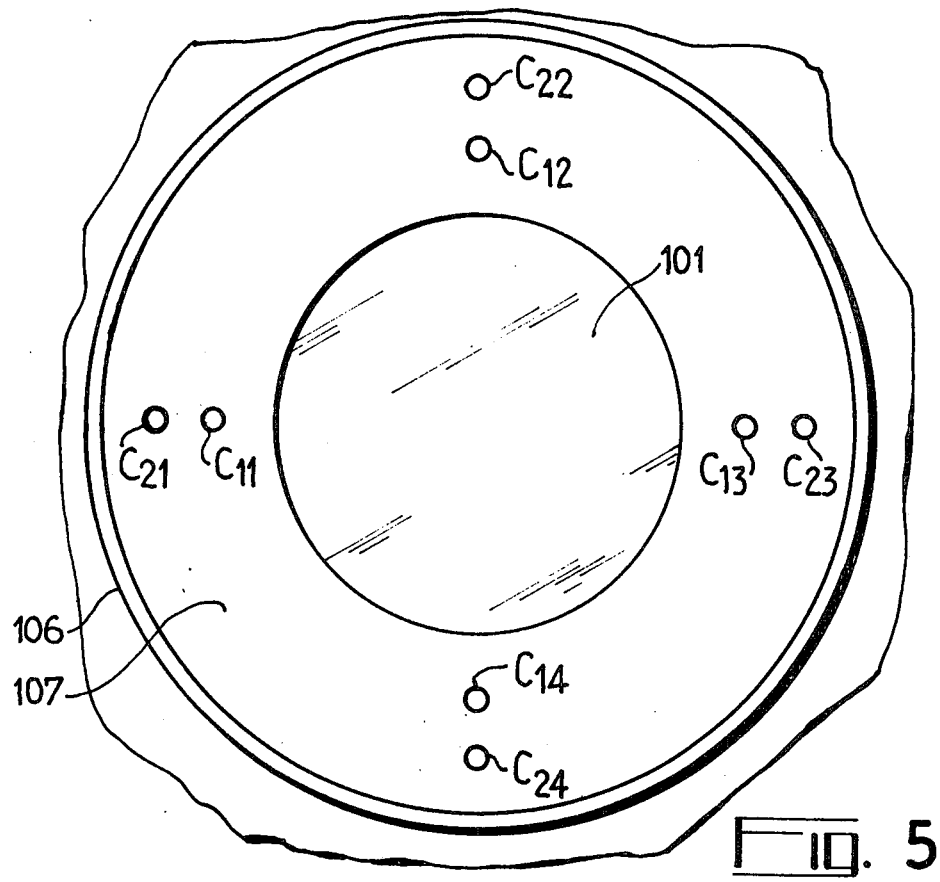
FIGS. 4 and 5 show respectively in section and from above the front face of the objective-holder.
Figure 4:
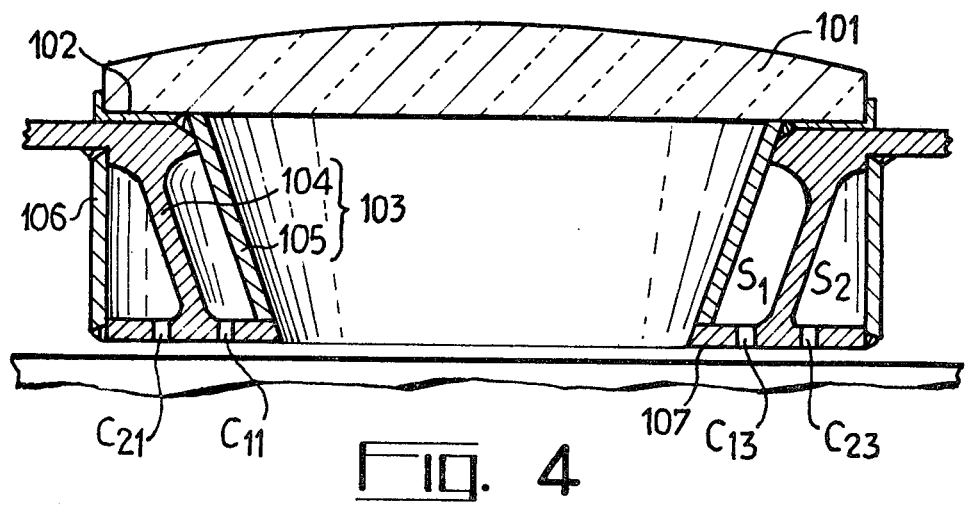

FIGS. 4 and 5 show respectively in section and from above the front face of the parts directly supporting the objective, i.e. that which is nearest to the sample.

On FIG. 4 is shown the lower part 119 of the objective-holder and on FIG. 5 the lower face of this part.

The objective itself 101 is held on a shoulder-piece 102 which is attached to the objective-holder. The objective-holder ends in a part 103 which is formed of two cone trunks 104 and 105 welded one to the other in their upper parts. A cylinder 106 completes the assembly.

In the jets contained between parts 104 and 105 and 104 and 106 a gas current circulates whose usefulness will be seen later. This assembly is at roughly 20 microns from the object itself.

Assembly 107 is shown on FIG. 5. Part 107 is pierced by eight holes or jets which direct a gaseous flux on the object-holder.

The jets are divided into two classes: jets $C_{11}$ to $C_{14}$ arranged in a circle of about 9 millimeters diameter (this is given as an example only). These jets are arranged at the four ends of two perpendicular diameters.

Jets $C_{21}$ to $C_{24}$ are arranged in a circle of about 11 millimeters diameter and on the same radii as jets $C_{11}$ to $C_{14}$ respectively. It is these jets which make possible the servo-control of the objective-holder in the position of the image to be printed. They are part of the differential transducers whose schematic is shown on FIG. 6.

FIG. 6 shows a pneumatic sensor such as may be used in a device in accordance with the invention. It is based on the fact that an obstacle at the output of a gas pipe causes the rate flow to vary. This variation in output causes a variation in pressure which becomes bigger as the obstacle approaches the output jet.

The sensor shown in FIG. 6 is of the differential type. Two tubes 31 and 32 receives a fluid at the same pressure. These tubes feed respectively two identical chambers 41 and 42 and two jets 51 and 52.

Jet 52 is closed by an adjustable valve 53. This valve causes a known, measured, reference pressure $P_R$ to be set up in a tube 62 which ends in the jet. Jet 51 directs the gas flux on the obstacle which is the surface at the distance z from the output of jet 51 to the sheet. These two tubes 62 and 61 open into a cavity 70 divided into two equal parts by an elastic membrane 71. The latter moves under the effect of the difference $P_R - P_M$.

This deformation causes a variation in impedance in the two circuits formed respectively by the two coils 81 and 82 which are placed in a metallic part which closes the cavity. As a result, when these two circuits receive the same input voltage V, their respective output voltages are $V_R$ and $V_M$ and $z = \theta(V_R - V_M)$.

The pressures used are of the order of 200 millibars. The reference pressure is adjusted to give a zero error signal for the sensor-image plane distance chosen, 20 to 30 microns for example.

This assembly enables the effects of the supply pressure to be eliminated.

The four jets $C_{11}$ to $C_{14}$ are connected together to form a single pneumatic sensor which delivers an analog signal $S_1$ through the transducer. This signal $S_1$ may be used to control the distance between the object and the objective either by means of an analog servo-control feedback loop or a digital type servo-control such as is described later.

The analog servo-control schematic diagram contains a transducer such as that in FIG. 6.

This transducer delivers a signal V(Z) which acts on the piezoelectric bars after amplification.

A schematic diagram other than that of FIG. 6 may be used. This is shown in FIG. 7 and enables a record of the servo-control signal obtained to be kept when printing on an area of the surface is finished before passing to the next area. When this is explained, the reason for the presence of eight jets will be understood whereas in the preceding case only four were required.

The four jets $C_{21}$ to $C_{24}$ are also connected together to form a single sensor which delivers a signal $S_2$. By means of a logic device which is not shown, this signal $S_2$ is converted into a digital signal with two levels 0 and 1. Level 0 is deliverd when one or more jets $C_2$ are outside the object, i.e., outside area $Z_1$ on the object; level 1 is delivered when the four jets are over the object. Feelers $C_{21}$ to $C_{24}$ form a proximity detector.

The analog servo-control schematic diagram contains a transducer such as the one in FIG. 6.

This transducer delivers a signal V(Z) which acts on the piezoelectric bars after amplification.

Two areas can be defined on the object depending on whether the 4 jets $C_1$ and 4 jets $C_2$ are simultaneously over the object (area $Z_1$) or whether jets $C_2$ are outside when jets $C_1$ are above (area $Z_2$). One of the purposes of the invention is to make clear photos (images) in areas $Z_1$ and $Z_2$ of the object by recording the position of the servo-control of the last position in $Z_1$ above the transition area $Z_2$ and even outside the object ($Z_3$).

Figure 9:
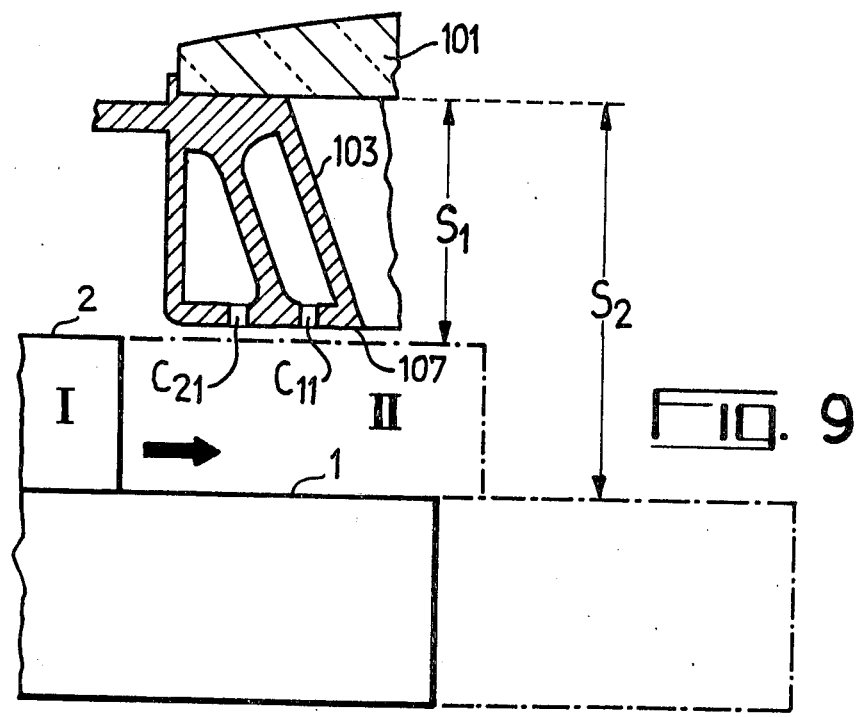
FIGS. 8 and 9 show from above and in section along a plane passing along one of the diameters containing the jets the objective-holder during an adjustment movement.
Figure 8:
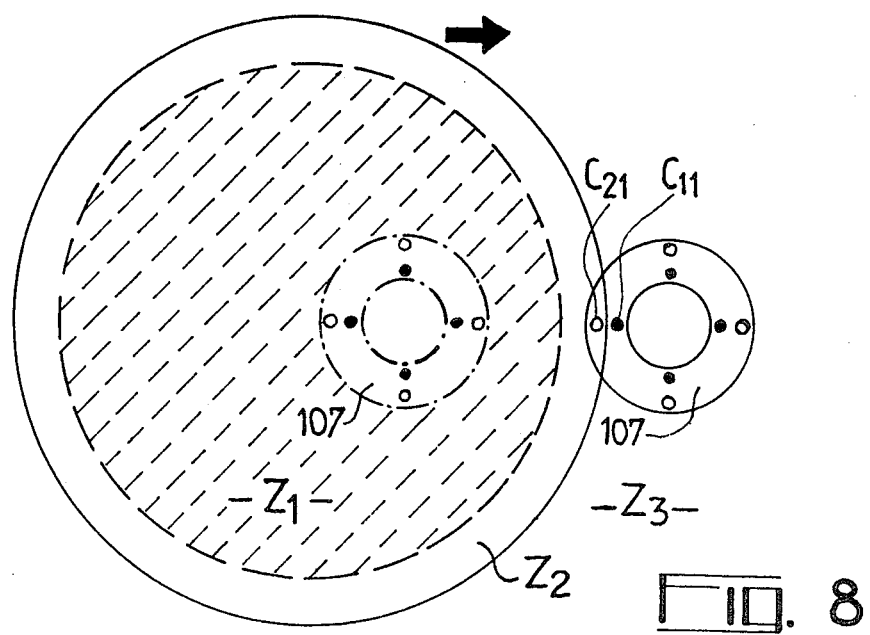

An explanation of the operation will be given using FIGS. 7, 8 and 9.

The circuit in FIG. 7 contains a monostable stage 1000 which gives the instruction for the servo-control to start. This monostable stage is connected to the input of an AND circuit 1001 which receives on its other input the signal $S_2$. In the "1" state, this signal opens the AND gate whose output is connected to an input of a flip-flop 1002 with two states "0" and "1". In other words, when the start signal is given and signal $S_2$ is at level 1, the flip-flop switches to state "1".

This flip-flop 1002 has an input for switching to the 0 state connected to a monostable stage 1011 which supplies a pulse to restore flip-flop 1002 to the 0 state.

This monostable stage is connected to the output of a zero detector 1010 whose output has two states "0" and "1". This monostable stage supplies a pulse at each switch from "1" to "0" of the output of detector 1010 as well as at each switch from "0" to "1".

The zero detector receives a reference voltage $V_o$ at its input which corresponds to the output voltage delivered by the transducer connected with feelers $C_1$, when the objective height is at the required value, 30 microns for example.

The transducer connected with jet $C_1$ delivers a voltage $V_o$ when $h = h_o$, $h_o$ being the height required for correct adjustment and a voltage V between, for example, $V_o - 5$ V and $V_o + 5$ V when $h_o - 100\mu < h < h_o + 100\mu$ (FIG. 10).

Voltage V and voltage $V_o$ are delivered to the inputs of circuit 1010 which supplies at its output a voltage with two levels "1" and "0" depending on whether $V < V_o$ or $V > V_o$.

This voltage is applied to two AND circuits 1005 and 1006, directly for circuit 1005 and through an inverter 1017 for 1006. It opens one or the other of these AND gates giving access to the count and discount inputs respectively of a up-count and down-count device 1007. This last circuit, through a digital analog converter 1008 and an amplifier 1009 acts on the piezoelectric control bars.

The two circuits 1005 and 1006 receive the pulses from a clock 1003 through an AND circuit 1004.

Circuit 1004 is opened by flip-flop 1002 when it is in the "1" state.

The assembly operates as follows:

In area $Z_1$, signal $S_2$ is in the state "1" and, when the instruction to perform an adjustment arrives at monostable circuit 1000, flip-flop 1002 is switched to state "1". Gate 1004 is then open and the clock pulses are applied to AND circuits 1005 and 1006. Depending on the value of V in the signal $S_1$, they are passed to the up-count or the down-count. For example, if $h > h_o$, i.e., $V > V_o$, gate 1005 will be open and the clock pulses will be applied to the count of the up-count and down-count device. The digital-analog converter 1007 will supply an increasing voltage which will be applied to the piezoelectric ceramic bars through the amplifier 1009.

The objective will close in towards the object plane and the value V in signal $S_1$ will decrease continuously. When it passes $V = V_o$, the zero detector changes state and triggers monostable circuit 1011 which returns flip-flop 1002 to the "0" state and closes gate 1004. The clock pulses no longer reach the counter 1007 which retains the count in its memory and thus fixes the position of the objective.

The instruction to perform an adjustment will be triggered before each fresh photo, or periodically by a clock for example.

On the instruction to perform an adjustment two cases may arise. If the objective is still over area $Z_1$, signal $S_2$ is in state "1" and the process is the same as that already described.

If the objective is in area $Z_2$ or outside the object in $Z_3$, signal $S_2$ is in state "0". In this case, flip-flop 1002 remains in state "0" and there is no new adjustment. The objective remains in its previous position. Its position will only be changed when there is a return over area $Z_1$.

This system has the advantage of retaining each count in the memory and in particular, if the objective-holder moves away from the sample-holder, the objective will keep the position previously occupied when signal $S_1$ has a meaning.

What I claim is:

1. A mask photorepeater apparatus for the production of several images of very small dimensions on the same sheet, comprising:
    a luminous source and an objective assembly holding a lens with a magnification power less than or equal to 1 projecting upon a sample the image of a mask;
    an object holder for holding said sample;
    a table supporting said holder;
    motors to bring the various areas of said sample in front of the lens as required, at each exposure, said object holder being fixedly held;
    said objective assembly containing means for moving said objective assembly along its optical axis so as to bring its object plane within the sample plane, said means including elastic means under stress to ensure a tendency to move said objective assembly, means for electrical control to counter the effect of said elastic means, said electrical means receiving control signals from pneumatic sensors connected with the objective assembly to control the distance from the lens to the sample plane.

2. An apparatus as claimed in claim 1, wherein said electrical control means comprise a piezoelectric bar, and said assembly comprising a two branch structure capable of being deformed elastically to form a lever, said bar pressing upon said two branches, said lever amplifying the movement of said objective with respect to that of said bars.

3. An apparatus as in claim 2, wherein springs are provided which press on said structure, said springs tending to counter the effect of the said bar.

4. An apparatus as claimed in claim 3, wherein said elastic means include an assembly of elastic springs connecting the said objective-holder to the said structure and tending to counter the effect of the said bar.

5. An apparatus as claimed in claim 1, having a part below said objective lens, said part carrying four first jets arranged at the respective ends of two perpendicular diameters of a circle, having a radius slightly greater than that of said objective lens and centered on said optical axis, said jets being the active elements of a differential pneumatic sensor.

6. An apparatus as claimed in claim 5, further comprising four additional jets placed in line with said jets and at the ends of diameters of a circle larger than the said circle, the said additional jets also forming the active elements of an another differential pneumatic sensor.

7. An apparatus as claimed in claim 6, wherein said other sensor produces electric signals triggering a logic circuit, said logic circuit containing a zero detector with an analog input and an output with two states "0" and "1", adopting the "0" state when the input signal is positive, the objective being at a greater distance from the object-holder than the required distance, and the "1" state in the opposite case.

8. An apparatus as claimed in claim 7, wherein said logic circuit includes a count up-count down device having a count up and a count down input and an assembly of gates and inverters, a clock, the said assembly switching the clock signals to said count up input when the zero detector supplies a "0" level signal and to said count down input when it supplies a "1" level signal, the said device having an output connected to a digital-analog converter and an amplifier connected to said converter whose output voltage controls said piezoelectric bars.

* * * * *